United States Patent [19]
Namizaki et al.

[11] 3,990,096
[45] Nov. 2, 1976

[54] SEMICONDUCTOR LUMINESCENT DEVICE

[75] Inventors: Hirofumi Namizaki; Akiko Ito, both of Amagasaki, Japan

[73] Assignee: Mitsubishi Denki Kabushiki Kaisha, Japan

[22] Filed: Aug. 25, 1975

[21] Appl. No.: 607,505

[30] Foreign Application Priority Data
Aug. 26, 1974 Japan.............................. 49-97771

[52] U.S. Cl................................... 357/18; 357/16; 357/17
[51] Int. Cl.²................. H01S 33/19; H01S 29/161
[58] Field of Search........................ 357/17, 16, 18

[56] References Cited
UNITED STATES PATENTS

| | | | |
|---|---|---|---|
| 3,824,493 | 7/1974 | Hakki............................ | 331/94.5 M |
| 3,855,607 | 12/1974 | Kressel................................ | 357/18 |
| 3,893,044 | 7/1975 | Dumke.......................... | 331/94.5 M |
| 3,936,855 | 2/1976 | Goell.................................. | 357/17 |
| 3,938,172 | 2/1976 | Lockwood............................ | 357/18 |

OTHER PUBLICATIONS
Namizaki et al., *Journ. of Appl. Physics*, vol. 45, No. 6, June 1974.

*Primary Examiner*—Martin H. Edlow
*Attorney, Agent, or Firm*—Robert E. Burns; Emmanuel J. Lobato; Bruce L. Adams

[57] ABSTRACT

The disclosed semiconductor luminescent device comprises a semiconductive body including a first semiconductor layer formed of a first semiconductive material and sandwiched between a second and a third semiconductor layer formed of a second semiconductive material having a resistivity higher than that of the first material by two orders of magnitude or more. Each of the first, second and third layers includes an $n$ and a $p$ type region. A first and a second electrode are connected to the $p$ and $n$ type regions of the first layer with low resistances respectively. Light is efficiently emitted from the first layer.

10 Claims, 8 Drawing Figures

SEMICONDUCTOR LUMINESCENT DEVICE

BACKGROUND OF THE INVENTION

This invention relates to improvements in a semiconductor luminescent device including two heterojunctions.

There have been previously proposed various attempts to improve the efficiency of energy conversion of semiconductor luminescent devices employing a semiconductor for converting an electrical energy to an optical energy and providing that optical energy as the output. For example, there have been already proposed semiconductor luminescent devices of the type including two hetero-junctions. Some of semiconductor luminescent devices of that type are called TJS laser devices. The TJS laser device comprises a semiconductive body including a first semiconductor layer formed of a first semiconductive material, and a second and a third semiconductor layer formed of a second semiconductive material and having the first semiconductor layer sandwiched therebetween to form hetero-junctions between the first semiconductor layer and the second and third semiconductor layers respectively. Each of the first, second and third semiconductor layers includes a p type region and n type region, and a pair of metallic electrodes are disposed in ohmic contact with the semiconductive body to apply a voltage across each p type region and the associated n type region. The second semiconductive material is selected to be broader in forbidden band-width than the first semiconductive material. Thus the p-n junction of the first semiconductor layer has a diffusion potential less than that of each of the second and third semiconductor layers. As a result, the application of a voltage across the pair of metallic electrodes causes a current to collectively flows through the p-n junction formed between the p and n type regions of the first semiconductor layer resulting in the efficient emission of light from that p-n junction and the vicinity thereof.

Also since semiconductive materials broad in forbidden band-width tend to be small in refractive index, the first semiconductive material has a large refractive index as compared with the second semiconductive material because the latter material has been selected to be broader in forbidden band-width as above described. Therefore light emitted from the p-n junction of the first semiconductor layer and the vicinity thereof is reflected from each of the hetero-junctions until light having a high density energy is radiated through the outer lateral surfaces of the first semiconductor layer. In this way, a high energy light can be effectively emitted from the TJS laser device.

It has been found that an increase in voltage applied across the pair of metallic electrodes on TJS laser devices causes a tendency to increase a leakage current flowing through each of the p-n junctions of the second and third semiconductor layers. This increase in leakage current results in the deterioration of the concentration with which a current flows through the p-n junction of the first semiconductor layer. This leads to the objection that the TJS laser devices decrease in efficiency of light emission.

Accordingly it is an object of the present invention to provide a new and improved semiconductor luminescent device preventing its efficiency of light emission from decreasing due to a flow of leakage current and retaining a high efficiency of light emission even with a high voltage applied thereacross.

SUMMARY OF THE INVENTION

The present invention provides a semiconductor luminescent device comprising a semiconductive body having a pair of first and second opposite main or major surfaces, and including a first semiconductor layer formed or made of a first semiconductive material, and a second semiconductor layer and a third semiconductor layer formed or made of a second semiconductive material and having the first semiconductor layer sandwiched therebetween. The first semiconductive material is narrower in forbidden band-width than the second semiconductive material. Each of the first, second and third semiconductor layers includes a first type and second type conductivity region to form a p-n junction therebetween. The second semiconductive material of the second and third semiconductor layers have an electric resistivity higher at least two orders of magnitude than that of the first semiconductor layer. The semiconductive material of the first semiconductor layer. The semiconductive body further includes a first metallic electrode connected to the first type conductivity region of the first semiconductor layer with a low resistance and a second metallic electrode connected to the second type conductivity region of the first semiconductor layer with a low resistance.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
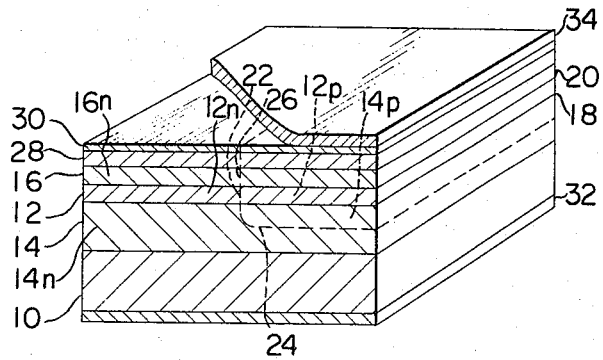
FIG. 1 is a fragmentary perspective view of a TJS laser device constructed in accordance with the principles of the prior art with a part broken away.

For a better understanding of the nature and objects of the present invention, a conventional TJS laser device will now be described in conjunction with FIG. 1 of the drawings. An arrangement illustrated in FIG. 1 comprises a substrate 10 of semiconductive material, in this case, gallium arsenide (GaAs), a first semiconductor layer 12 formed, for example, of gallium arsenide (GaAs) and a second and a third semicondutor layers 14 and 16 respectively formed, for example, of gallium aluminum arsenide (GaAlAs). As shown in FIG. 1, the second semiconductor layer 14 is sandwiched between the substrate and first semiconductor layers 10 and 12 respectively to form a hetero-junction 18 between the first and second semiconductor layers 12 and 14 and the third semiconductor layer 16 is disposed on that surface of the first semiconductor layer 12 remote from the second layer 14 to form a hetero-junction 20 therebetween. The first semiconductor layer 12 includes an n type region 12n and a p type region 12p to form a p-n junction 22 therebetween. The second semiconductor layer 14 also includes an n type region 14n and a p type region 14to form a p-n junction 24 therebetween. Similarly the third semiconductor layer 16 includes an n type region 16n and a p type region 16p to form a p-n junction 26 therebetween.

A fourth semiconductor layer 28 is disposed upon the third semiconductor layer 16 and overlaid by a fifth semiconductor layer 30. The fourth semiconductor layer 28 is formed of p type gallium aluminum arsenide (GaAlAs) while the fifth semiconductor layer 30 is formed of a p type gallium arsenide (GaAs).

A first metallic electrode 32 is disposed in ohmic contact with the exposed surface of the substrate 10 and a second metallic electrode 34 is disposed in ohmic contact with the exposed surface of the fifth semiconductor layer 30.

Figure 2:
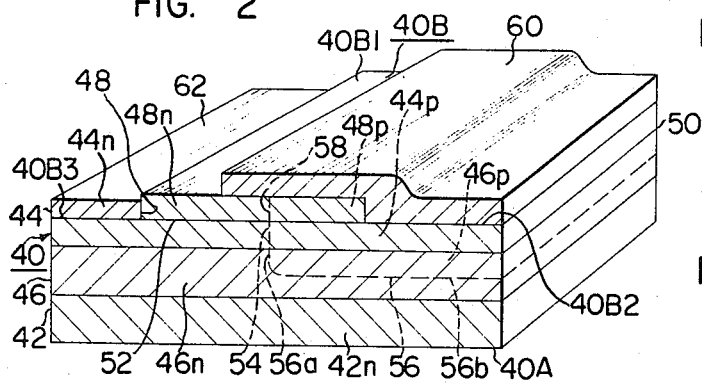
FIG. 2 is a fragmentary perspective view of a semiconductor luminescent device constructed in accordance with the principles of the present invention.

Referring now to FIG. 2, there is illustrated a semiconductor luminescent device constructed in accordance with the principles of the present invention. The arrangement illustrated comprises a semiconductive body generally designated by the reference numeral 40 and including a semiconductor substrate 42, a first semiconductor layer 44 formed of a first semiconductive material and a second and a third semiconductor layer 46 and 48 respectively formed of a second semiconductive material. The semiconductor substrate 42 defines one of the main or major opposite surface in this case, a main lower surface 40A as viewed in FIG. 2 of the semiconductive body 40 and the second semiconductor layer 46 is sandwiched between the substrate 42 and the first semiconductor layer 44 to form a hetero-junction 50 between the first and second semiconductor layers 44 and 46. The third semiconductor layer 48 is disposed on the central portion of that surface of the first semiconductor layer 44 remote from the second semiconductor layer 46 to form a heterojunction 52 therebetween. The hetero-juntion 50 and 52 are substantially parallel to the main lower surface of 40A of the semiconductive body 40.

As shown in FIG. 2, the semiconductive body 40 has the other or upper main surface 40B including a first section 40B1 defined by the third semiconductor layer 48 and a second and a third section 40B2 and 40B3 respectively defined by those portions of the first semiconductor layer 44 not overlaid by the third semiconductor layer 48 to be located on both sides of the first surface section 40B1. The second and third sections 40B2 and 40B3 of the main upper surface 40B are coplaner with the hetero-junction 52 and have their level less than the first section 40B1 by a thickness of the third semiconductor layer 48.

The semiconductor substrate 42 is entirely formed of a region 42n of a one type conductivity in the example illustrated, of an n type conductivity, while the semiconductor layers 44, 46 and 48 include respective regions 44n, 46n and 48n of the one type conductivity for example, the n type conductivity and respective regions 44p, 46p and 48p of the other or p type conductivity to form therebetween p-n junction 54, 56 and 58 continuous to one another within the semiconductive body 40. The p-n junction 58 extends through the third semiconductor layer 48 so as to perpendicularly intersect both the first section 40B1 of the main upper surface 40B and the hetero-junction 52. The p-n junction 54 extends through the first semiconductor layer 44 so as to perpendicularly intersect the hetero-junctions 50 and 52. The p-n junction 56 includes one portion 56a perpendicularly intersecting the hetero-junction 50 and the other portion 56b extending within the second semiconductor layer 46 in substantially parallel relationship with the heterojunction 50.

The first semiconductive material forming the first semiconductor layer 44 and the second semiconductive material forming the second and third semiconductor layers are selected so that the first semiconductive material is narrower in forbidden band-width and higher in refractive index than the second semiconductive material. For example, when the first semiconductive material is gallium arsenide (GaAs), the second semiconductive material may be gallium aluminum arsenide (GaAlAs) or gallium arsenide phosphide (GaAsP). In this event, the substrate 42 is formed of gallium arsenide (GaAs). Alternatively, with cadmium sulphide selenide (CdSSe) used as the first semiconductive material, cadmium sulphide (CdS) is used as the second semiconductive material and the substrate 42 is formed of cadmium sulphide selenide (CdSSe).

According to the principles of the present invention, the second semiconductive material of the second and third semiconductor layers should be higher in electric resistivity than the first semiconductive material of the first semiconductor layer. It has been found that, in order to efficiently operate the semiconductor luminescent device in the laser oscillation mode, the first semiconductive material thereof should have its resistivity ranging from $10^{-2}$ to $10^{-4}$ ohm-centimeter. On the other hand, the second semiconductive material of the second and third semiconductor layers should have an electric resistivity higher than that of the first semiconductive material by two orders of magnitude or more and preferably three orders of magnitude or more. For example, when the first semiconductive material has a resistivity of $10^{-2}$ ohm-centimeter, the second semiconductive material is required to have a resistivity of 1 ohm-centimeter or more and preferably of at least 10 ohms-centimeter. Also when the first semiconductive material has a resistivity of $10^{-4}$ ohm-centimeter, the second semiconductive material is required to have a resistivity of at least $10^{-2}$ ohm-centimeter and preferably of $10^{-1}$ ohm-centimeter or more.

In the example illustrated the first semiconductor layer 44 is formed of a first semiconductive material having a resistivity of $10^{-3}$ ohm-centimeter, and the second and third layers are formed of a second semiconductive material having a resistivity of at least $10^{-1}$ ohm-centimeter and preferably of at least 1 ohm-centimeter, for example $10^4$ ohms-centimeter.

The arrangement further comprises a pair of first and second metallic electrodes 60 and 62 disposed in ohmic contact with the main upper surface 40B of the semiconductive body 40. More specifically, the first metallic electrode 60 is located upon the first and second sections 40B1 and 40B2 of the main upper surface 40B to contact the p type region 44p of the first semiconductor layer 44 and the p and n type regions 48p and 48n of the third semiconductor layer 48, and the second electrode 62 is located upon the third section 40B3 of the main upper surface 40B to contact both the n type region 44n of the first semiconductor layer 44 and the n type region 48n of the third semiconductor layer 48. It is to be noted that the first electrode 60 particularly contacts the p type region 44p of the first semiconductor layer 44 with a low resistance while the second electrode 62 particularly contacts the n type region 44n of the first semiconductor layer 44 with a low resistance. In the example illustrated, each of the metallic electrodes 60 or 62 is in the form of a layer joined to the body 40 and including a chromium layer portion overlaid by a gold layer portion.

The arrangement of FIG. 2 is operated as follows: A voltage is applied across the first and second metallic electrodes 60 and 62 to render the first electrode 60 positive with respect to the second electrode 62. This cause a current to collectively flow through a first current path traced from the first electrode 60 through the p type region 44p of the first semiconductor layer 44, the p–n junction 54, the n type region 44n of the first layer 44 and thence to the second electrode 62 for the following reasons. Firstly, the current is concentrated into a current path traversing the p–n junction 54 rather than the p–n junctions 56 and 58 because the p–n junction 54 is less in diffusion potential than the p–n junctions 56 and 58 due to the relationship $E_{g1}<E_{g2}$ where $E_{g1}$ and $E_{g2}$ designate forbidden band-widths of the first and second semiconductive materials respectively. Secondly, the resistivity of the second and third semiconductor layers 46 and 48 is higher at least two orders of magnitude than that of the first semiconductor layer 44 to permit a sufficiently low component of the current to flow through the second or third semiconductor layers 46 or 48 respectively. More specifically, the semiconductive body 40 will include, in addition to the first current path as above described, a second current path traced from the first electrode 60 through the p type region 48p of the third semiconductor layer 48, the p–n junction 58, the n type region 48n of the third layer 48 and thence to the second electrode 62, and a third current path traced from the first electrode 60 through the p type region 44p of the first semiconductor layer 44, the p type region 46p of the second layer 46, the p–n junction 56, the n type region 44n of the first layer 44 and thence to the second electrode 62. Even though the voltage applied across the electrodes 60 and 62 would become higher, a current flowing through each of the second and third current paths is sufficiently suppressed for the two reasons above described.

The embodiment of the present invention as shown in FIG. 2 is first characterized in that, by rendering the resistivity of the second and third semiconductor layers 46 and 48 less than that of the first semiconductor layer 44 by two orders of magnitude or more, the currents flowing through the second and third current paths as above described can be maintained at sufficiently low magnitudes for the second reason as above described even though a voltage applied across the electrodes 60 and 62 becomes high. The embodiment as shown in FIG. 2 is further characterized in that the first and second electrodes 60 and 62 respectively are directly disposed in ohmic contact with the p and n type regions 44p and 44n of the first semiconductor layer 44 to cause a current traversing the p–n junction 54 to collectively flow through the first current path not including the second and third semiconductor layers 46 and 48 respectively. The latter characteristic feature will be more fully understood by comparing the arrangement of FIG. 2 with that shown in FIG. 1 on the assumption that in FIG. 1 the second and third semiconductor layers 14 and 16 are higher in resistivity than the first semiconductor layer 12. Under the assumed condition a current traversing the p–n junction 22 flows through both the p type region 16p of the third semiconductor layer 16 and the n type region 14n of the second semiconductor layer 14. As a result, the current traversing the junction 22 will greatly decrease.

In the arrangement of FIG. 2, the current collectively flows through the first current path to traverse the p–n junction 54 as above described. As a result, the laser oscillation effectively occurs at and adjacent to that p–n junction 54 resulting in the efficient emission of light. The light emitted at and adjacent to the p–n junction 54 is repeatedly reflected from the hetero-junctions 50 and 52 because the first semiconductive material of the first semiconductor layer 44 is larger in refractive index than the second semiconductive material of the second and third semiconductor layers 46 and 48 respectively. Thus light having a high density energy is radiated through both lateral ends of the first semiconductor layer 44.

The arrangement of FIG. 2 accomplishes not only the efficient emission of light just described but also has several advantages. For example, as the second and third semiconductor layers 46 and 48 respectively are sufficiently higher in resistivity than the first semiconductor layer 44, and particularly the third layer 48 is so, both the first and second electrodes 60 and 62 are permitted to be joined to the third semiconductor layer 48 without any special caution. Although the arrangement of FIG. 2 includes the first electrode 60 disposed in ohmic contact with both the n and p type regions 48n and 48p of the third semiconductor layer 48 and the second electrode 62 disposed in ohmic contact with n type region 48n of the third semiconductor layer 48, the latter layer is effective for maintaining a sufficient low magnitude of a leakage current flowing through the third semiconductor layer 48 while bypassing the p–n junction 54 due to the sufficiently high resistivity thereof.

On the other hand, the arrangement of FIG. 1 has the fourth semiconductor layer 28 formed of p type gallium aluminum arsenide (GaAlAs) and disposed on the third semiconductor layer 16 thereby to suppress a current from the electrode 34 flowing through the layers 28 and 30, the n type regions 16n, 12n and 14n of the layers 16, 12 and 14 and the n type substrate 10 into the electrode 32. The arrangement of FIG. 2 eliminates the necessity of providing that semiconductor layer corresponding to the fourth semiconductor layer 28 as shown in FIG. 1.

The electrodes 60 and 62 directly connected to the first semiconductor layer 44 provides another advantage. It is known that, if a metallic electrode is connected to GaAs that a resistance therebetween becomes generally low. In the arrangement of FIG. 1, the fifth semiconductor layer 30 is particularly used to decrease a resistance between the electrode and the associated layer. However, the arrangement of FIG. 2 includes the electrodes 60 and 62 connected to the first semiconductor layer 44 formed of GaAs. This eliminates the necessity of using a special layer corresponding to the fifth semiconductor layer 30 as shown in FIG. 1.

Further since the electrodes 60 and 62 are formed on one of the main surfaces 40B of the semiconductive body 40, the thickness of the substrate 42 can be suitably selected while the conditions of that surface can be readily be controlled as desired. This results in the relief of stresses applied to the interior of crystalline layers formed in superposed relationship upon the substrate 42 and therefore in a decrease in deterioration of the resulting semiconductor element due to those internal stresses. As a result, the element can increase in useful life. The fact that the internal stresses exerted on the crystalline layers adversely affects the characteristics and particularly the operating life holds for general semiconductor elements and particularly remarkable for semiconductor elements including the hetero-junction. It is known that conventional double hetero-junction lasers can be much improved in useful life by using soft metals such as indium (In) as bonding solders. By modifying the conventional structure wherein a pair of opposite electrodes different in coefficient of thermal expansion from each other carry therebetween both opposite surfaces of a stack of a plurality of crystalline layers superposed on one another, to the structure including a pair of electrodes disposed on one surface of the stack alone as shown in FIG. 2, internal stresses applied to the crystalline layers can greatly decrease. Further the latter structure is expected to increase in useful life.

Figure 3A:
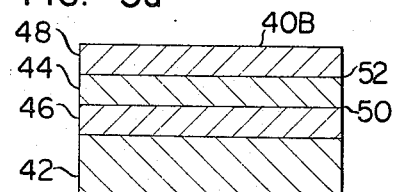
FIGS. 3a through 3d are fragmentary sectional views illustrating the various manufacturing steps of producing the arrangement shown in FIG. 2.

The arrangement of FIG. 2 can be manufactured by the steps as shown in FIGS. 3a through 3d. In the steps as shown in FIG. 3a the semiconductive body 40 is produced by epitaxially growing the second semiconductor layer 46 of n type GaAlAs on the n type GaAs substrate 42, the first semiconductor layer 44 of n type GaAs on that second semiconductor layer 46 and the third semiconductor layer 48 of n type GaAlAs on the first semiconductor layer 44 one after another as by liquid-phase epitaxial technique well known in the art. The second and third semiconductor layers 46 and 48 high in resistivity are possible to be grown on the substrate and first layer 42 and 44 respectively as by liquid epitaxial technique using an impurity, chromium as well known in the art and also it is possible to make the resulting resistivity as high as about $10^5$ to $10^6$ ohms-centimeter. In the step as shown in FIG. 3a, the third semiconductor layer 48 is disposed on the entire exposed surface of the first semiconductor layer 44 to define the main upper surface 40B of the semiconductive body 40.

Figure 3B:
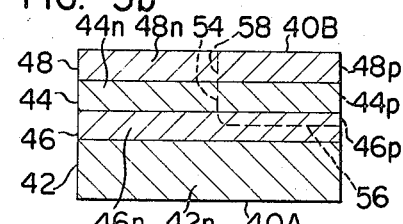

The next succeeding step is to selectively diffuse a p type impurity such as zinc into one half, in this case, the right half as viewed in FIG. 3b of the main upper surface 40B until the impurity reaches the second semiconductor layer 46. As a result, the layers 44, 46 and 48 are divided into the n type regions 44n, 46n and 48n and the p type regions 44p, 46p and 48p respectively while the p–n junctions 54, 56 and 58 are formed between these n and p type regions respectively. The resulting structure is shown in FIG. 3b.

Figure 3C:
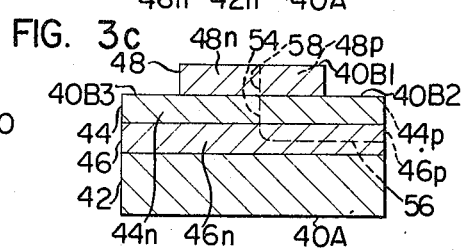

Following this, both lateral portions of the third semiconductor layer 48 are selectively etched away until both lateral portions of the first semiconductor layer 44 are exposed to the main upper surface 40B to define the second and third sections 40B2 and 40B3. The resulting structure is shown in FIG. 3c.

Figure 3D:
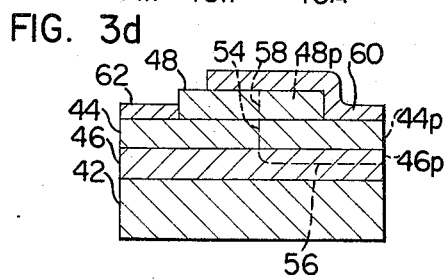

In the step as shown in FIG. 3d, an electrode material consisting, for example, of chromium is first evaporated on the main upper surface 40B in its entirety by using vacuum evaporation technique well known in the art. Then gold is similarly evaporated upon the chromium layer thus formed to provide a composite electrode member. Thereafter that portion of the composite electrode member deposited on the lefthand portion of the second section 40B2 of the main upper surface 40B is suitably etched away to form the first and second electrodes 60 and 62 as shown in FIG. 3d.

Figure 4:
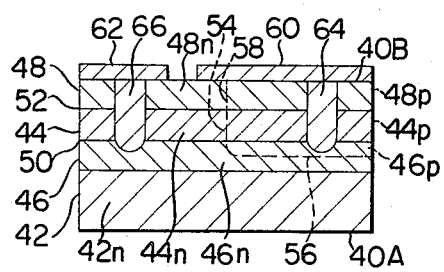
FIG. 4 is a fragmentary sectional view of a modification of the present invention.

FIG. 4 wherein like reference numerals designate the components identical or similar to those shown in FIG. 2 illustrates a modification of the present invention. In the arrangement of FIG. 4, the first semiconductor layer 44 is not exposed to the main upper surface 40B formed to be flat upon the third semiconductor layer 48. The electrodes 60 and 62 disposed on the main upper surface 40B are respectively connected to the p and n type regions 44p and 44n of the first semiconductor layer 44 through individual electrically conductive regions 64 and 66 engaged at one end by the associated electrodes and extending through the third and first semiconductor layer 48 and 44 respectively. The conductive regions 64 and 66 has the other end reaching the second semiconductor layer 46. The conductive regions 64 and 66 may be formed by putting small pieces of suitable metal such as gold at selected positions on the main upper surface 40B followed by heating of the semiconductive body 40. The conductive regions 64 and 66 are less in resistivity than the first semiconductor layer 44 and effective for electrically connecting the electrodes 60 and 62 to the regions 44p and 44n of the first semiconductor layer 44 with low resistances.

In other respects the arrangement of FIG. 4 is substantially identical to that shown in FIG. 2.

Figure 5:
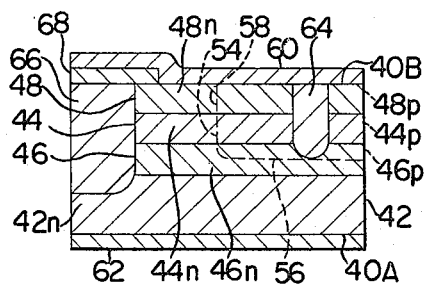
FIG. 5 is a view similar to FIG. 4 but illustrating another modification of the present invention.

In FIG. 5 wherein like reference numerals designate the components identical or corresponding to those shown in FIG. 2 there is illustrated another modification of present invention or a modification of the arrangement as shown in FIG. 2. As shown in FIG. 5, the electrode 60 is disposed on the main upper surface 40B excepting that one edge portion thereof, in this case, the lefthand edge portion thereof as viewed in the same Figure is underlaid by an electrically insulating layer 68 disposed on the main upper surface 40B. The electrically conductive region 66 exposed to the main surface 40B is electrically insulated from the electrode 60 through the insulating layer 68 and extends through the third, first and second semiconductor layers 48, 44 and 46 until it reaches the n type substrate 42 sufficiently low in resistivity. Then the electrode 62 is disposed on the main lower surface 40A of the semiconductor body 40 to be substantially coextensive with the surface 40A. Thus the electrode 62 is electrically connected to the n type region 44n of the first semiconductor layer 44 through the substrate and conductive region 42 and 66 respectively and with a low electric resistance.

In other respects the arrangement is substantially identical to that shown in FIG. 2 or 3.

While the present invention has been illustrated and described in conjunction with a few preferred embodiments thereof it is to be understood that numerous changes and modifications may be resorted to without departing from the spirit and scope of the present invention.

What we claim is:

1. A semiconductor luminescent device comprising, a semiconductive body having a pair of opposite major surfaces and including a first semiconductor layer made of a first semiconductive material, a second and a third semiconductor layers made of a second semiconductive material and having said first semiconductor layer sandwiched therebetween, each of said first, second and third semiconductor layers including a first type conductivity region and a second type conductivity region defining a p–n junction therebetween, said second semiconductive material having a forbidden band-width broader than that of said first semiconductive material and an electric resistivity higher than that of said first semiconductive material by at least two orders of magnitude, and a pair of first and second metallic electrodes located on said semiconductive body, said first metallic electrode being connected to said first type conductivity region of said first semiconductor layer with a low resistance, and said second metallic electrode being connected to said second type conductivity region of said first semiconductor layer with a low resistance.

2. A semiconductor luminescent device as claimed in claim 1 wherein said second semiconductive material is higher in electric resistivity than said first semiconductive material by at least three orders of magnitude.

3. A semiconductor luminescent device as claimed in claim 1 wherein said first and second type conductivity regions of said first semiconductor layer are exposed to said second main surface of said semiconductive body, and wherein said first and second electrodes are joined to said first and second type conductivity regions of said first semiconductor layer respectively.

4. A semiconductor luminescent device as claimed in claim 1 wherein said semiconductive body further includes a first electrically conductive region connected to said first type conductivity region of said first semiconductor layer and a second electrically conductive region connected to said second type conductivity region connected to said second type conductivity region of said first semiconductor layer, said first electrode being coupled to said first type conductivity region of said first semiconductor layer through said first conductive region with a low resistance, said second electrode being coupled to said second type conductivity region of said first semiconductor layer through said second conductive region with a low resistance.

5. A semiconductor luminescent device as claimed in claim 4 wherein both said first and second electrodes are disposed on said second major surface of said semiconductive body.

6. A semiconductor luminescent device as claimed in claim 1 wherein said first semiconductive material has an electric resistivity of from $10^{-4}$ to $10^{-2}$ ohm-centimeter and said second semiconductive material has an electric resistivity ranging from $10^{-2}$ to at least 1 ohm-centimeter.

7. A semiconductor luminescent device as claimed in claim 2 wherein said first semiconductive material has an electric resistivity of from $10^{-4}$ to $10^{-2}$ ohm-centimeter and said second semiconductive material has an electric resistivity ranging from $10^{-1}$ to at least 10 ohms-centimeter.

8. A semiconductor luminescent device as claimed in claim 1 wherein said first semiconductive material is gallium arsenide (GaAs) and said second semiconductive material is gallium aluminum arsenide (GaAlAs).

9. A semiconductor luminescent device as claimed in claim 1 wherein said first semiconductive material is gallium arsenide (GaAs) and said second semiconductive material is gallium arsenide phosphide (GaAsP).

10. A semiconductor luminescent device as claimed in claim 1 wherein said first semiconductive material is cadmium sulphide selenide (CdSSe) and said second semiconductive material is cadmium sulphide (CdS).

* * * * *